United States Patent

Hassan et al.

[11] Patent Number: 5,968,198
[45] Date of Patent: *Oct. 19, 1999

[54] DECODER UTILIZING SOFT INFORMATION OUTPUT TO MINIMIZE ERROR RATES

[75] Inventors: Amer A. Hassan, Cary; Ali S. Khayrallah, Apex; Yi-Pin Eric Wang, Raleigh; Kumar Balachandran; Rajaram Ramesh, both of Cary, all of N.C.

[73] Assignee: Ericsson, Inc., Triangle Park, N.C.

[ * ] Notice: This patent issued on a continued prosecution application filed under 37 CFR 1.53(d), and is subject to the twenty year patent term provisions of 35 U.S.C. 154(a)(2).

[21] Appl. No.: 08/699,101

[22] Filed: Aug. 16, 1996

[51] Int. Cl.$^6$ .............................. H03M 13/00; H04L 1/16
[52] U.S. Cl. .......................... 714/752; 714/751; 714/755; 714/780
[58] Field of Search .............................. 371/37.01, 37.06, 371/35, 37.4, 37.11

[56] References Cited

U.S. PATENT DOCUMENTS

| | | |
|---|---|---|
| 4,573,155 | 2/1986 | Currie et al. . |
| 4,939,731 | 7/1990 | Reed et al. . |
| 5,392,299 | 2/1995 | Rhines et al. ........................... 371/37.5 |
| 5,442,627 | 8/1995 | Viterbi et al. ............................. 370/22 |
| 5,457,704 | 10/1995 | Hoeher et al. ............................. 371/43 |

FOREIGN PATENT DOCUMENTS 0 625 829   11/1994   European Pat. Off. .

OTHER PUBLICATIONS

Koorapaty, H., et al., "Map Decoding for Satellite Channels", Apr. 28, 1996, pp. 477–481.

Loeliger, H.-A., "A Practical Reliability Metric for Block Codes Used on Binary–Input Channels", IEEE Transactions on Communications, vol. 38, No. 4, Apr. 1990, pp. 405–408.

Hoeher, P., "Advances in Soft–Output Decoding", GLOBECOM '93, pp. 793–797, Dec. 1993.

*Primary Examiner*—Stephen M. Baker
*Attorney, Agent, or Firm*—Jenkens & Gilchrist, P.C.

[57] ABSTRACT

A coding system is disclosed wherein the receive side includes a decoder capable of producing, in addition to the hard information decoded output, either or both symbol and/or bit soft information values. For a certain information bit position, a value proportional to the joint probability that a received symbol and the set of all hypothesized transmitted codewords that led to the estimated or detected hard information output is calculated. The calculated probabilities with respect to plural codewords having a zero in that certain information bit position are compared to the calculated probabilities with respect to the plural codewords having a one in that certain information bit position. The result of the comparison provides an indication of whether the hard information output in that same information bit position is more likely a one or a zero. The output soft information values are further processed in comparison to a preset threshold, with instances exceeding the threshold triggering block rejections and/or retransmissions.

31 Claims, 5 Drawing Sheets

DECODER UTILIZING SOFT INFORMATION OUTPUT TO MINIMIZE ERROR RATES

BACKGROUND OF THE INVENTION

1. Technical Field of the Invention

The present invention relates to the coding and decoding of digital data for transmission over a communications channel and, in particular, to a system decoder utilizing soft information outputs to minimize error rates in the transmitted digital data.

2. Description of Related Art

There exist many applications where large volumes of digital data must be transmitted and received in a substantially error free manner. In telecommunications systems, in particular, it is imperative that the reception of digital data be accomplished as reliably as is possible. Reliable communication of digital data is difficult, however, because the communications channels utilized for data transmission are plagued by error introducing factors. For example, such errors may be attributable to transient conditions in the channel (like noise or multi-path fading). The influence of such factors results in instances where the digital data is not transmitted properly or cannot be reliably received.

Considerable attention has been directed toward discovering methods for addressing the instances of errors which typically accompany data transmission activities. For example, it is well known in the art to employ forward error correction (FEC) codes and other means to locate, counteract, correct and/or eliminate these errors. The data stream is thus encoded in accordance with a plurality of predefined codewords established in a codebook for that particular encoding scheme. Once encoded, the random errors introduced therein during transmission are relatively easily located and corrected during a corresponding decoding process using well known mathematical processes.

The codewords output from the encoder are transmitted over a communications channel and corrupted to some degree by noise to create a vector. During decoding, the received vector comprising the encoded data (perhaps including errors) is compared against each of the plurality of codewords in the codebook for the specific encoding process used. The codeword closest to the received vector is selected, and its corresponding data word is output from the decoder. This output is often referred to as the hard information output.

In many coding systems, a decoder additionally produces soft (or side) information outputs to help another decoder identify, and perhaps correct, introduced errors. For example, in one scenario used in the Global System for Mobile (GSM) communication, an inner decoder comprising an equalizer generates a soft information output derived from path metric differences, and an outer decoder comprising an error control decoder utilizes the output soft information to detect and correct introduced errors. In another scenario used in the PRISM-TDMA communications system, the inner decoder comprises an improved multiband excitation (IMBE) error control decoder generating estimates of the number of channel errors, and the outer stage decoder comprises a speech decoder which utilizes the output error estimates in determining whether to discard data.

Soft information outputs have historically been generated by the decoder in conjunction with the selection of the closest codeword and its associated hard information output. The reliability information comprising the soft information output is calculated for each individual symbol (bit) within the hard information output. Accordingly, in such decoders the reliability of each symbol (bit) within the hard information output vector is derived without taking into consideration either the remaining symbols within that hard information output vector or any other considered codewords (and associated hard information output vectors). This is achieved by comparing the probability of the received data given a bit with a logical value of one was transmitted to the probability of the received data given a bit with a logical value of zero was transmitted.

SUMMARY OF THE INVENTION

A decoder in a coding communications system of the present invention produces, in addition to a hard information output estimate of a received symbol, a soft (or side) information output comprising the relative reliability of the detection of that estimated output. The relative reliability soft information output for a certain information bit position is determined by calculating a value proportional to the joint probability that the received symbol and the set of all hypothesized transmitted codewords led to the estimated or detected hard information output. A comparison is then made of the calculated probabilities with respect to plural codewords having a zero in that certain information bit position and the calculated probabilities with respect to the plural codewords having a one in that certain information bit position. The result of the comparison provides an indication of whether the hard information output in that same information bit position is more likely a one or a zero.

In another aspect of the present invention, the soft information outputs are further processed in comparison to a preset threshold. Responsive to instances where the soft information outputs exceed the threshold, data block rejections and/or retransmissions are ordered.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
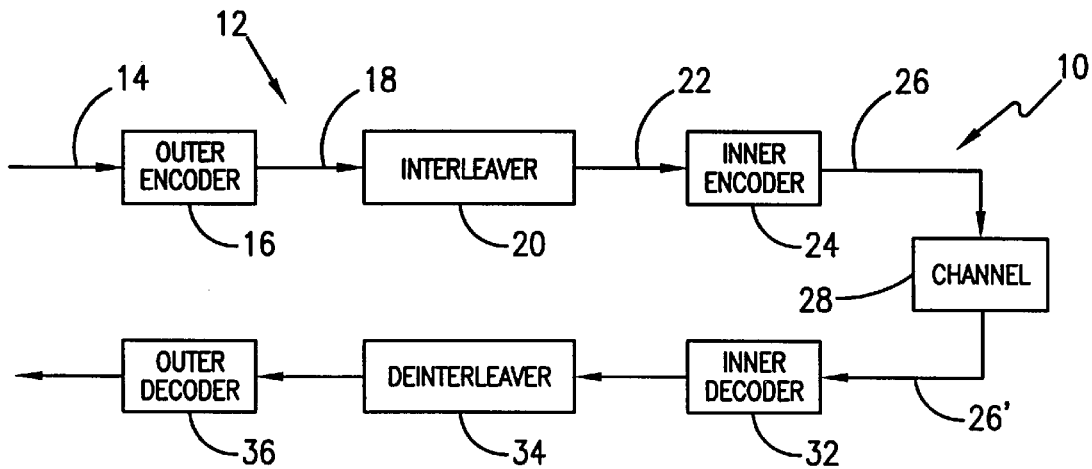
FIG. 1 is a block diagram of a prior art cross-interleaved coding system.

Reference is now made to FIG. 1, wherein there is shown a block diagram of a prior art cross-interleaved coding system 10. On the transmit side 12 of the system 10, encoding of a received original data stream is accomplished in three steps. First, the data stream received on line 14 is encoded by a first, outer encoder 16. Next, the encoded data stream output on line 18 is interleaved by an interleaver 20. Finally, the interleaved data stream output on line 22 is encoded by a second, inner encoder 24. The encoded data stream output on line 26 is then transmitted over a communications channel 28. On the receive side 30 of the system 10, decoding of the transmitted data stream received on line 26' to recover the original data stream is accomplished by performing corresponding decoding and de-interleaving steps in a complementary three-step order utilizing an inner decoder 32, a de-interleaver 34, and an outer decoder 36, respectively.

Figure 2:
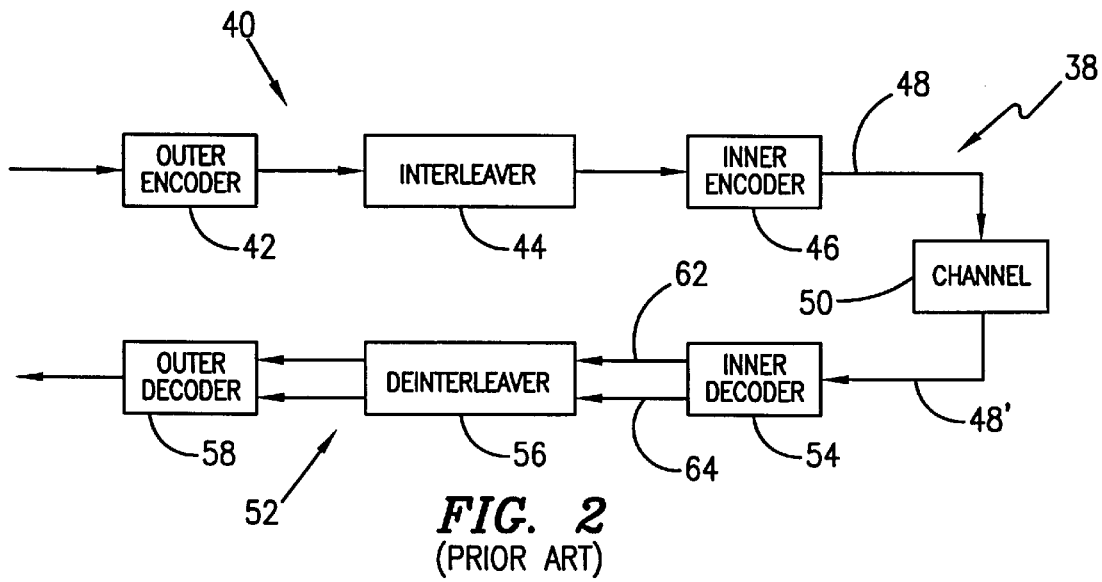
FIG. 2 is a block diagram of a prior art coding system having soft information output decoding capabilities.

Reference is now made to FIG. 2, wherein there is shown a block diagram of a prior art coding system 38 having soft information output decoding capabilities. On the transmit side 40, the system 38, like the system 10 of FIG. 1, includes an outer encoder 42, an interleaver 44, and an inner encoder 46. The data stream output on line 48 from the transmit side 40 is carried by a communications channel 50. On the receive side 52, the system 38, like the system 10 of FIG. 1, includes an inner decoder 54, a de-interleaver 56, and an outer decoder 58 for processing the channel transmitted data stream to recover the originally input data stream (hard information outputs).

The inner decoder 54 further functions to generate soft (or side) information outputs on line 62 in conjunction with the decoding operation performed on the data stream received on line 48' after transmission over the communications channel 50. For example, the inner decoder 54 may comprise an equalizer, with the soft information outputs derived from path metric differences. In another example, the inner decoder 54 may comprise an improved multiband excitation (IMBE) decoder, with the soft information outputs estimating the number of introduced channel errors. The inner decoded data stream output on line 64, along with the soft information outputs, output on line 62, are de-interleaved by the de-interleaver 56 and passed on to the outer decoder 58. The received soft information outputs are then used by the outer decoder 58 to assist in the decoding operation and, in particular, to help identify and correct errors in the data stream.

The decoder 54 typically functions to calculate reliability information comprising the soft information output for each individual symbol (bit) within the hard information output. This is achieved by taking the logarithm of the ratio of two probabilities: first, the probability of the received data given a bit with a logical value of one was tranmitted; and second, the probability of the received data given a bit with a logical value of zero was transmitted. Accordingly, in such decoders 54 the reliability of each symbol (bit) within the hard information output vector is derived without taking into consideration either the remaining symbols within that hard information output vector or any other considered codewords (and associated hard information output vectors).

Figure 3:
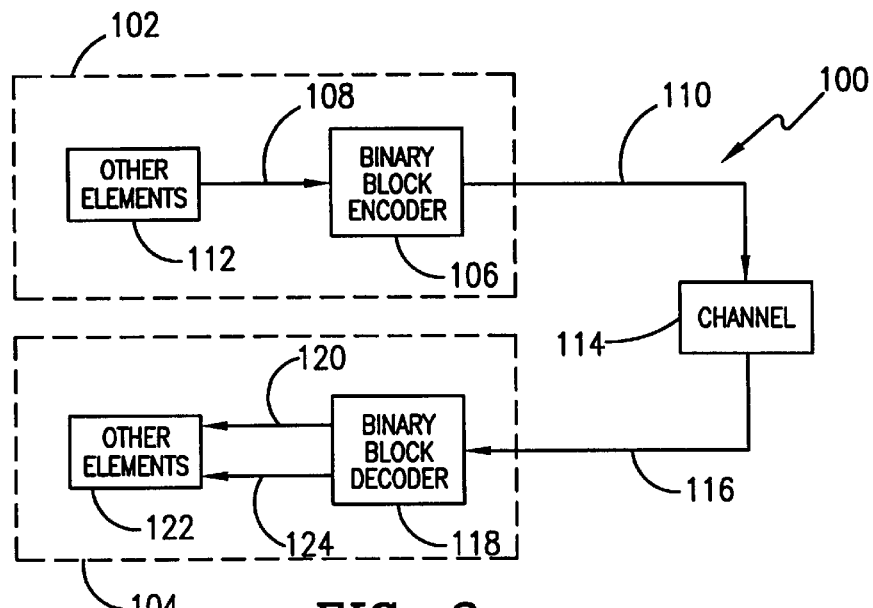
FIG. 3 is a block diagram of a binary block coding system of the present invention.

Reference is now made to FIG. 3, wherein there is shown a block diagram of a binary block coding system 100 of the present invention. The system 100 includes a transmit side 102 and a receive side 104. On the transmit side 102, the system 100 includes an (n,k) binary block encoder 106 wherein a block of "k" data digits received on line 108 is encoded by a codeword of "n" code digits in length (wherein n>k) for output on line 110. The data digits $(d_1, d_2, d_3, \ldots, d_k)$ in each block comprise a k-dimensional vector d. Similarly, the code digits $(c_1, c_2, c_3, \ldots, c_n)$ in each codeword comprise an n-dimensional vector c. Each codeword includes m check digits (wherein m=n-k) among the code digits, with the check digits being useful in later detecting (and perhaps correcting) t number of channel errors introduced into the (n,k) code, where t depends on the particular code being used. The transmit side 102 of the system 100 may further include a number of other encoding and/or interleaving elements as generally referred to at 112. Although illustrated as being positioned before the encoder 106, it will be understood that other encoding and/or interleaving elements may be positioned after as well.

The coded output vector c of the (n,k) binary block encoder 106 is transmitted through a communications channel 114 which may introduce a number of errors producing an n-dimensional vector received codeword $r=(r_1,r_2,r_3, \ldots ,r_n)$ on line 116. On the receive side 104, the system 100 includes a maximum likelihood (n,k) binary block decoder 118 which decodes a received codeword r of n data digits in length to output a block x of k data digits, wherein $x=(x_1, x_2, x_3, \ldots, x_k)$ is not necessarily equal to d due to the introduced channel errors. The decoding operation performed by the decoder 118 computes the Euclidean distance $D(r, y_i)$ between r and every codeword $y_i=(y_{i1}, y_{i2}, y_{i3}, \ldots, y_{in})$ in the appropriate codebook, wherein $y_{in}$ is in ±1 form, for i=1 to 2. In the standard maximum likelihood decoder 118, the codeword y closest to r is chosen, and its corresponding hard information bits $x=(x_1,x_2,x_3, \ldots ,x_k)$ are produced as the hard output on line 120. The receive side 104 of the system 100 may further include a number of other encoding and/or interleaving elements as generally referred to at 122, positioned before and/or after the decoder 118, corresponding to those included at 112 in the transmit side 102.

In addition to the hard information bits x output from the decoder 118 on line 120, the decoder further generates a soft (or side) information vector output $s=(s_1,s_2,s_3, \ldots ,s_k)$ on line 124. In accordance therewith, a set C of the L closest codewords y to r is identified. The choice of L involves a tradeoff between complexity of the following calculation and soft information output quality. Preliminary testing has indicated that choosing L as small as between two and four results in satisfactory soft information output values. For each information bit location j, for j=1 to k, the set C is partitioned into a first set $C^{(j,0)}$, and a second set $C^{(j,1)}$. A codeword y is included in the first set $C^{(j,0)}$, if the j-th information bit corresponding to that codeword is zero (0). Conversely, a codeword is included in the second set $C^{(j,1)}$ if the j-th information bit corresponding to that codeword is one (1).

The soft information output vector s thus may determined by the decoder 118 as follows:

$$s_j = \ln \left( \frac{\sum_{y_i \in C^{(j,0)}} e^{\frac{-D(r, y_i)^2}{2\sigma^2}}}{\sum_{y_i \in C^{(j,1)}} e^{\frac{-D(r, y_i)^2}{2\sigma^2}}} \right) \quad (1)$$

wherein:
  $\sigma^2$ represents the variance of additive white Gaussian noise;
  j=1 to k, to index across the information bit locations; and
  i=1 to n, to index across all of the codewords.
In both the numerator and the denominator of Equation 1, the exponential portion produces a value that is proportional to the joint probability of having received the vector r and of a certain codeword y having been transmitted. Said another way, the exponential portion produces a value that is proportional to the probability of receiving the vector r given a certain codeword y having been transmitted. The numerator thus sums the calculated joint probabilities (taken by the exponential portion) for all the codewords y included in the first set $C^{(j,0)}$ (i.e., those included codewords y having a zero in the j-th information bit position). In the denominator, a summation is made of the calculated joint probabilities (taken by the exponential portion) for all the codewords y included in the second set $C^{(j,1)}$ (i.e., those included codewords y having a one in the j-th information bit position). The likelihood of having either a zero or a one for the hard information output x bit at issue is taken by dividing the numerator by the denominator. The resulting ratio is greater than one if the probability of having a zero in the j-th information bit exceeds the probability of having a one. Conversely, the resulting ratio is less than one if the probability of having a one in the j-th information bit exceeds the probability of having a zero. By taking the logarithm, when the value of $s_j$ is greater than zero ($s_j>0$), this means that a zero (0) is more likely for the corresponding hard information bit $x_k$. Conversely, when the value of $s_j$ is less than zero ($s_j<0$), this means that a one (1) is more likely for the corresponding hard information bit $x_k$.

Equation (1) can be approximated fairly well as follows:

$$s_j \approx - \min_{y_i \in C^{(j,0)}} \frac{D(r, y_i)^2}{2\sigma^2} + \min_{y_i \in C^{(j,1)}} \frac{D(r, y_i)^2}{2\sigma^2} \quad (2)$$

The common portion of the first and second terms of Equation 2, like with the exponential portion of Equation 1, produces a value that is proportional to the joint probability of having received the vector r and of a certain codeword y having been transmitted. The first term then calculates the negative of the closest Euclidean distance between the received data vector r and a hypothetical codeword y having a logical value of zero in the j-th information bit position (i.e., those codewords included in the first set $C^{(j,0)}$). The second term calculates the closest Euclidean distance between the received data vector r and a hypothetical codeword y having a logical value of one in the j-th information bit position (i.e., those codewords included in the second set $C^{(j,1)}$). When the value of $s_j$ is greater than zero ($s_j>0$), this means that a zero (0) is more likely for the corresponding hard information bit $x_k$. Conversely, when the value of $s_j$ is less than zero ($s_j<0$), this means that a one (1) is more likely for the corresponding hard information bit $x_k$.

An advantage of using the approximation of Equation (2) is that noise variance, which would have to be estimated otherwise, can now be dropped. This results in a scaling, which is irrelevant. It should be noted that in the event that $C^{(j,0)}$ is empty, the value of $s_j$ is set equal to $+\infty$. Similarly, in the event that $C^{(j,1)}$ is empty, the value of $s_j$ is set equal to $-\infty$.

It is noted that the mathematical operation of minimizing the Euclidean distance $D(r,y_i)$ is equivalent to maximizing the correlation p, as follows:

$$\rho_i = \sum_{j=1}^{n} r_j y_{ij} \quad (3)$$

wherein:
n is the block length of the codeword; and
i=1 to n, to index over all codewords $y_i$.

It is then possible to rewrite the soft information output of Equation (1) using standard manipulations as follows:

$$s_j = \ln \left( \frac{\sum_{y_i \in C^{(j,0)}} e^{\frac{\rho_i}{\sigma^2}}}{\sum_{y_i \in C^{(j,1)}} e^{\frac{\rho_i}{\sigma^2}}} \right) \quad (4)$$

and the approximation of Equation (2) may be rewritten as follows:

$$s_j \approx \max_{y_i \in C^{(j,0)}} \frac{\rho_i}{\sigma^2} - \max_{y_i \in C^{(j,1)}} \frac{\rho_i}{\sigma^2} \quad (5)$$

Either Equation (2) or Equation (5) may then be used by the decoder 118 in determining the soft information output. The choice of one over the other is made in accordance with whether distances or correlations are more readily available in and to the decoder 118.

Figure 4:
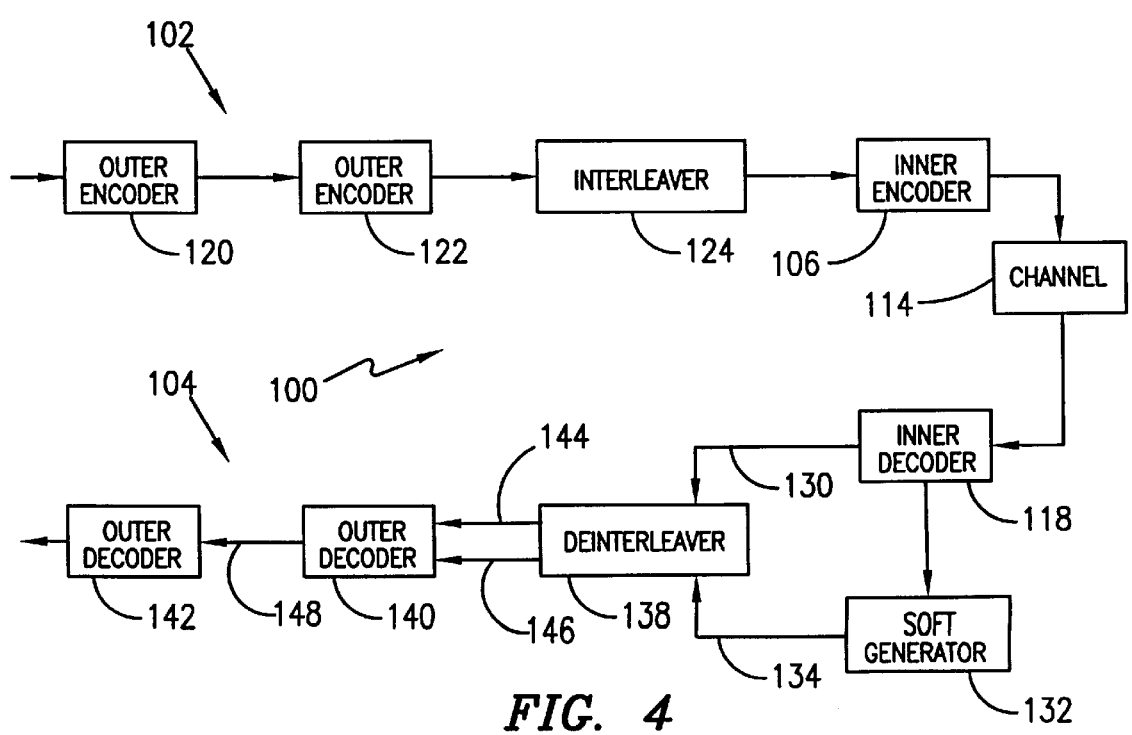
FIG. 4 is a block diagram of a particular implementation of the coding system of FIG. 3.

Reference is now made to FIG. 4 wherein there is shown a block diagram of a particular implementation of the coding system 100 of FIG. 3. The system 100 includes a transmit side 102 and a receive side 104. On the transmit side 102, the system 100 includes additional encoding and/or interleaving elements 112 comprising a first, outer encoder 120, a second, middle encoder 122, and an interleaver 124. The outer encoder 120 comprises an ($N_2,N_1$) cyclic redundancy check (CRC) encoder providing message error detection capability. The middle encoder 122 comprises a convolutional encoder which operates, in connection with the inner, (n,k) binary block encoder 106 to provide a concatenated encoding operation useful in providing error correction capability. The interleaver 124 positioned between the middle encoder 122 and the inner encoder 106 is useful in preventing burst errors introduced by either the communications channel 114 or the subsequent decoding operation.

The inner encoder 106 preferably utilizes ($2^k$,k) Hadamard encoding to implement a special class of binary block codes referred to as orthogonal codes. Use of such orthogonal codes is preferred due to their relatively simple decoder implementations and possibility of noncoherent demodulation. The encoding process may be described by $y_i=f(x_1,x_2,x_3,\ldots,x_k)$ for i=1 to $2^k$, wherein $y_i$ is the output codeword, f refers to the encoding function, and b refers to the bits to be encoded. The code book for the encoder 106 thus consists of $2^k$ codewords y.

The coded output of the inner ($2^k$,k) Hadamard encoder 106 is transmitted through the communications channel 114 to the receive side 104 of the system 100. The receive side 104 includes an inner binary block decoder 118 which decodes the Hadamard encoded codewords utilizing a fast Hadamard transform (FHT) to find the correlations of Equation (3). The Hadamard transform is well known in signal processing and coding theory, and a number of fast implementations have been developed. An appropriate one of those implementations is selected for use in the decoder 118.

A $2^k \times 2^k$ Hadamard matrix can be constructed by the following induction:

$$H^{(0)} = [1] \quad (6)$$

$$H^{(m)} = \begin{bmatrix} H^{(m-1)} & H^{(m-1)} \\ H^{(m-1)} & -H^{(m-1)} \end{bmatrix} \quad (7)$$

The columns of $H^{(k)}$ are the codeword of the Hadamard code in a specific order. The Hadamard transform components of Equations (6) and (7) coincide with the correlations of Equation (3), that is:

$$rH^{(k)} = (\rho_1 \ldots \rho_{2^k}) \quad (8)$$

In this implementation, the matrix H is symmetric. This is in fact the Hadamard transform. To obtain the hard information for output on line 130, the index to the largest $\sigma_i$, for i=1 to $2^k$, is found, and the corresponding natural binary representation thereto is output.

The receive side 104 of the system 100 further includes a soft information generator 132 associated with the decoder 118. The soft information output is determined by the soft information generator 132 using Equation (5), and output on line 134. The L largest $\sigma_i$'s, for i=1 to $2^k$, and their indices are selected. In this case, I represents the set of those indices, and $B_j(i)$ is the j-th bit of the natural binary representation of i. For the j-th information bit, the following provides a simple and reasonably accurate approximate log-likelihood ratio:

$$s_j \approx \max_{i \in I \ \& \ B_j(i)=0} \rho_i - \max_{i \in I \ \& \ B_j(i)=1} \rho_i \quad (9)$$

where the maximum is set to $-\infty$ if the set is empty. When the value of $s_i$ is greater than zero ($s_j > 0$), this means that a zero (0) is more likely for the corresponding hard information bit $x_k$. Conversely, when the value of $s_j$ is less than zero ($s_j < 0$), this means that a one (1) is more likely for the corresponding hard information bit $x_k$.

Put another way, the soft information generator 132 produces soft output $s=(s_1,s_2,s_3,\ldots,s_k)$ on line 134 for the corresponding hard information output $x=(x_1,x_2,x_3,\ldots,x_k)$ output on line 130. This soft information output is based on the following algorithm:

$$s_i = \sum_{j \in M_1^i} e^{H_j} - \sum_{j \in M_0^i} e^{H_j} \quad \text{where:} \quad (10)$$

$$M_l^i = \{j \mid x_i = l, f(x_1, \ldots, x_k) = y_j\} \quad (11)$$

For each hard information bit $x_i$, the code book is partitioned into two subsets, corresponding to $x_i=1$ or $x_i=0$. The correlation values associated with the codeword in the same subset are added to obtain a likelihood indication of whether $x_j=1$ or $x_i=0$. The soft information bit $s_i$ for a corresponding hard information bit $x_i$ is generated by taking the difference of the likelihood indications.

The receive side 104 of the system 100 further includes additional decoding and de-interleaving elements generally referred to at 136 comprising a de-interleaver 138, a middle decoder 140 and an outer decoder 142. The de-interleaver 138 is connected to lines 130 and 134 to receive the outputs of the decoder 118 and soft information generator 132. The output lines 144 (hard information bits) and 146 (soft information bits) from the de-interleaver 138 are connected to the middle decoder 140 which comprises a convolutional decoder. The middle decoder 140 utilizes the soft information output received on line 146 to minimize the bit error rate or sequence error rate of the hard information output received on line 144. This is accomplished, for example, by detecting errors in the received bit stream and then correcting as many of the detected errors as is possible. The output line 148 (hard information bits only) from the middle decoder 140 is connected to the outer decoder 142 which comprises a cyclic redundancy check (CRC) decoder. The outer decoder 142 functions to detect any remaining errors in the data stream.

Figure 5:
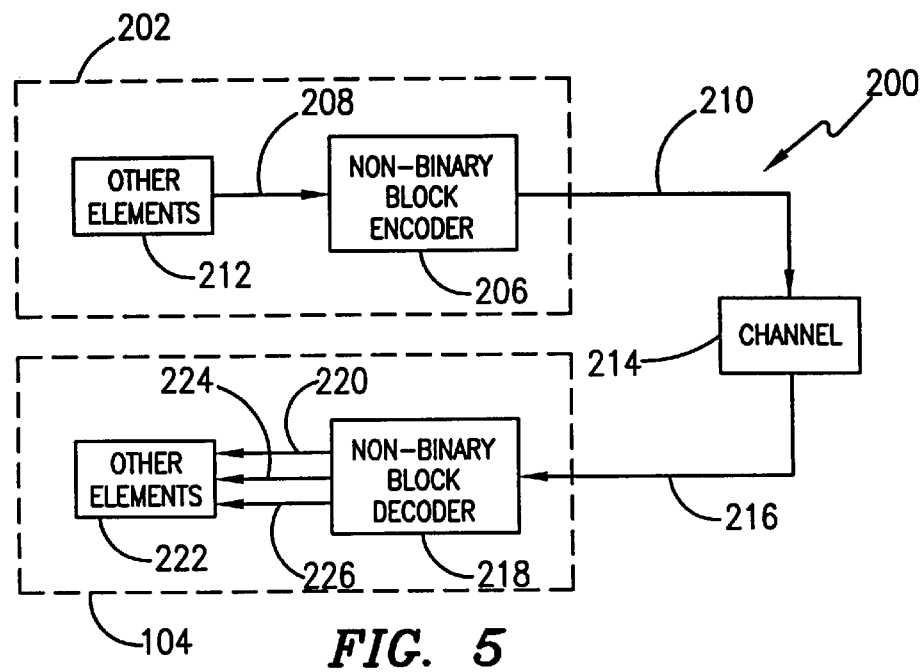
FIG. 5 is a block diagram of a non-binary block coding system of the present invention.

Reference is now made to FIG. 5 wherein there is shown a block diagram of a non-binary block coding system 200 of the present invention. The system 200 includes a transmit side 202 and a receive side 204. On the transmit side 202, the system 200 includes a non-binary block encoder 206 wherein a received data signal d on line 208 is encoded for output on line 210. Examples of such encoders include: an M-ary block Reed-Solomon encoder; or a modulator for an M-ary signal constellation (such as quadrature amplitude modulation (QAM) or phase shift keying (PSK)). The transmit side 202 of the system 200 may further include a number of other encoding and/or interleaving elements as generally referred to at 212. Although illustrated as being positioned before the encoder 206, it will be understood that other encoding and/or interleaving elements 212 may be positioned after as well. The coded output c of the encoder 206 is transmitted through a communications channel 214 which may introduce a number of errors producing a received code signal r on line 216. On the receive side 204, the system 200 includes a correspondingly appropriate non-binary decoder 218 which decodes the received codeword r to generate an output z, wherein z is not necessarily equal to d due to the introduced channel errors.

The decoding operation performed by the decoder 118 computes the Euclidean distance $D(r,y_i)$ between r and every codeword $y_i$. The codeword y closest to r is chosen, and its corresponding hard information symbols $z=(z_1,\ldots,z_k)$, and hard information bits $x=(x_1,\ldots,x_k)$, are produced as the output on line 220, wherein the symbol $z_j$ corresponds to the m bits $(x_{(j-1)m+1},\ldots,x_{jm})$. The receive side 204 of the system 100 may further include a number of other encoding and/or interleaving elements as generally referred to at 222, positioned before and/or after the decoder 218, corresponding to those included at 212 in the transmit side 202.

In addition to the hard information symbols z and bits x output from the decoder 218 on line 220, the decoder further generates a soft symbol information vector output s' on line 224, and a soft bit information vector output s on line 226. In accordance with this operation, a set C of the L closest codeword y to r is identified. The choice of L involves a tradeoff between complexity of the following calculation and soft information output quality. Preliminary testing has indicated that choosing L as small as between two and four results in satisfactory soft information output values. In a manner similar to the binary case described above, the set C is partitioned into M subsets $C^{(j,0)},\ldots,C^{(j,M-1)}$, for each location j. To simplify the computations, the following approximation is made: for each symbol l, we find:

$$\delta^{j,l} \approx \min_{y_i \in C^{(j,l)}} D(r, y_i) \quad (12)$$

Only the symbols $l_0$ and $l_1$ are kept with:

$$\delta^{j,l_0} \approx \min_l \delta^{j,l} \quad (13)$$

$$\delta^{j,l_1} \approx \operatorname{nmin}_l \delta^{j,l} \quad (14)$$

wherein, nmin denotes the second smallest number (i.e., the next minimum). The remaining symbols are treated as if their probability is zero. Thus, the most likely information symbol is $l_0$, the next most likely information symbol is $l_1$, and the soft value for the symbol at location j is:

$$s'_j \approx \delta^{j,l_0} - \delta^{j,l_1} \qquad (15)$$

As a final step, soft values are calculated for the information bits. The m bits with index (j−1)m+h, for h=1, . . . ,m, correspond to the j-th symbol. Assuming a map is given between the blocks of m bits and the symbols, for each h, the symbol set {0, . . . ,M−1} is partitioned into a first subset $E^{(h,0)}$ and a second subset $E^{(h,1)}$ of symbols. A symbol set M is included in the first subset $E^{(h,0)}$ if the h-th information bit is zero (0). Conversely, a symbol set is included in the second subset $E^{(h,1)}$ if the h-th information bit is one (1). Then, the soft value for the bit at location (j−1)m+h is:

$$s_{(j-1)m+h} \approx \min_{l \in E^{(h,0)}} \delta^{j,l} - \min_{l \in E^{(h,1)}} \delta^{j,l} \qquad (16)$$

which is interpreted in the same manner as Equation (2).

The issue of whether the soft symbol s' or soft bit s values output on lines 224 and 226, respectively, are more meaningful to the receive side 204 of the system 200 depends on the decoding elements, generally referred to at 222, included in the system after the decoder 218. For instance, suppose the next decoder stage is a Reed-Solomon decoder over an alphabet of size M. In such a case, soft symbol values are more useful. On the other hand, if the next stage is a binary block decoder, or a speech decoder that processes bits, then soft bit values are more useful.

Figure 6:
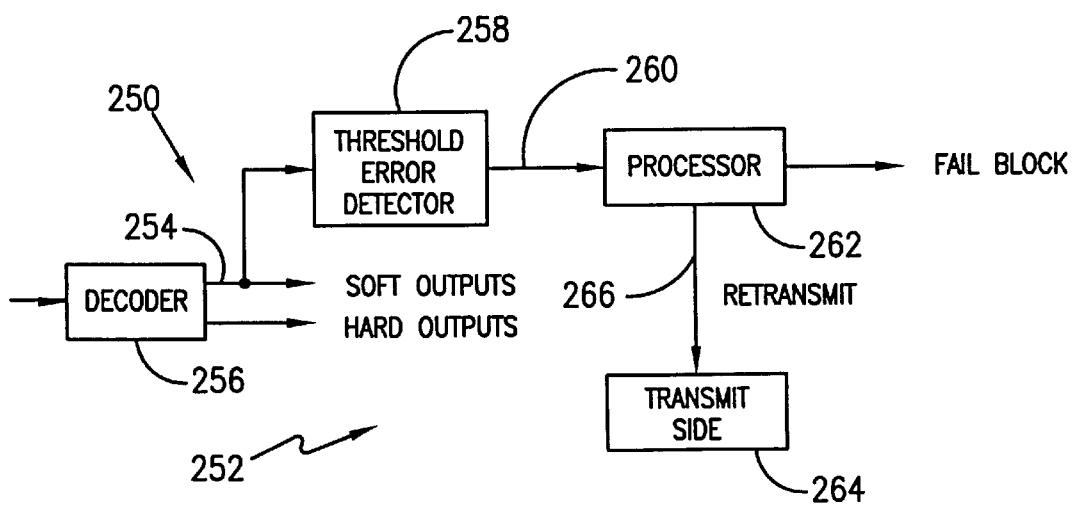
FIG. 6 is a block diagram of a coding system implementing block failure and retransmission functions responsive to soft information outputs.

The soft values (bit and/or symbol) are useful in ways other than to assist with error minimization and correction in subsequent stage decoders. Referring now to FIG. 6, there is shown a block diagram of a receive side 250 of a data communications system 252 wherein the soft value output(s) 254 from a decoder 256 (like those shown in FIGS. 3 and 5) are processed by a threshold error detector 258. An output 260 from the threshold error detector 258 is set on a block by block basis if the soft value output(s) 254 corresponding to that block exceed a given threshold value. The threshold, for example, may be set to a value indicative of the presence of more errors in the data stream than are capable of correction by the receive side 250 of the system 252. Responsive to the output 260 being set, a processor 262 on the receive side 250 of the system 252 may fail the block. In this connection, it will be noted that the threshold error detector 258 performs an analogous function to the cyclic redundancy check decoder of FIG. 4 which is used for pure error detection. Thus, when the system includes a threshold error detector 258 and processor 262, there may be no need to include either a cyclic redundancy check encoder on the transmit side 264, or a cyclic redundancy check decoder on the receive side 250. The failure decision made by the processor 262 could depend on whether any soft value outputs exceed the threshold or, alternatively, on whether a certain minimum number of the soft value outputs exceed the threshold. The processor 262 may further respond to the output 260 indicative of the soft value outputs 254 exceeding the set threshold by signaling the transmit side 264 of the system 252 over line 266 to request retransmission of the portion of the data stream containing the errors.

Reference is now made to FIGS. 7–12 wherein there are shown functional block diagrams of the decoder 118, 218 or 256 (including the soft information generator 132) of the present invention. The decoder 118, 218 or 256 is preferably implemented as a specialized digital signal processor (DSP) or in an application specific integrated circuit (ASIC). It will, of course, be understood that the decoder 118, 218 or 256 may alternatively be implemented using discrete components and perhaps distributed processing. In either case, the decoder 118, 218 or 256 performs the functional operations illustrated in FIGS. 7–12 to implement the mathematical operations previously described.

Figure 7:
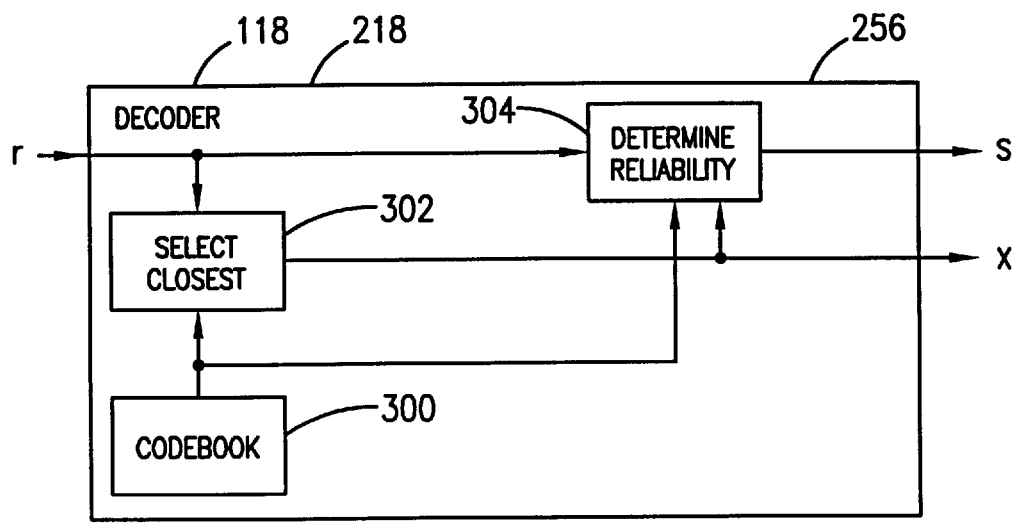
FIGS. 7–12 are functional block diagrams of the decoder of the present invention.

Referring first to FIG. 7, the decoder 118, 218 or 256 receives the vector r for processing. The decoder 118, 218 or 256 stores a codebook 300 containing all codewords y for the particular coding scheme being implemented. A comparator 302 receives the vector r and each of the codewords y, and functions to select the particular one of the codewords which is closest to the received vector. This operation may comprises, for example, a maximum likelihood operation. The choice of the particular type of comparison performed depends in large part on the type of coding scheme being used. In any event, the various available comparison functions as well as their specific implementations are well known to those skilled in the art. The selected closest codeword is then converted to its corresponding information data comprising the output hard information vector x. The decoder 118, 218 or 256 further includes a functionality for determining the reliability 304 of the output hard information vector x. This reliability information is output as a vector s, and it often referred to as soft (or side) information output.

Figure 8:
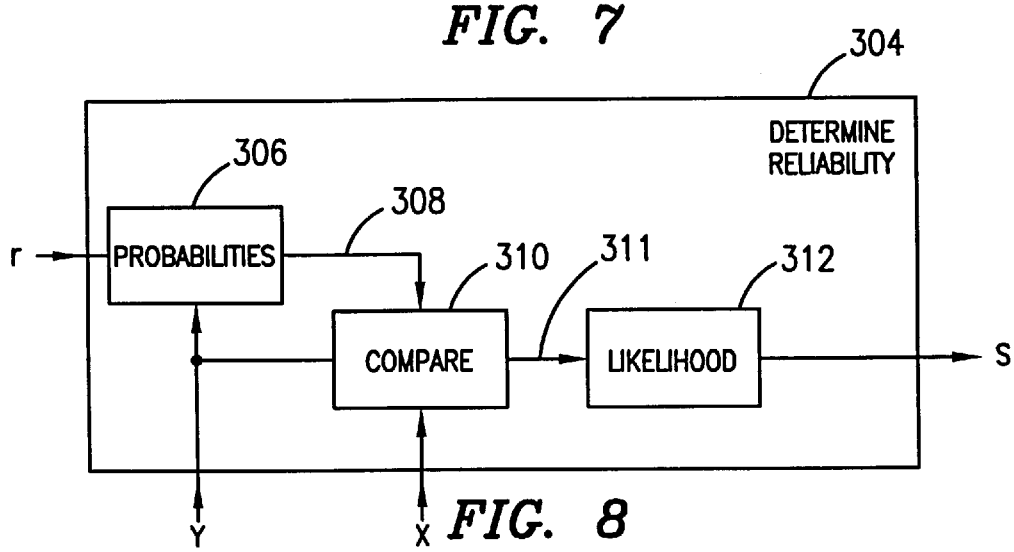

Reference is now made to FIG. 8 wherein there is shown a functional block diagram of a first embodiment of the reliability determination functionality 304 of the decoder 118, 218 or 256. The reliability determination functionality 304 receives the vectors r, x and y. An included probability determination functionality 306 takes as its inputs the received vector r and the plurality of codewords y and then calculates values proportional to the probability of receiving the received vector r given the hypothetical transmission of each of the plurality of codewords y. See, for example, exponential portion of Equations 1 and 4, and the corresponding portions of Equations 2 and 5. These probability values are output on line 308. A comparator 310 receives the probability values on line 308, the codewords y, and the hard information output vector x, and compares the calculated probabilities with respect to certain ones of the codewords having a logical zero in a given information bit location to the calculated probabilities with respect to certain ones of the codewords having a logical one in a given information bit location. This comparison is made for each of the information bit locations in the hard information output vector x. The results of the comparisons are output on line 311 to a likelihood functionality 312 which determines for each of the information bit locations in the hard information output vector x whether a logical one or a logical zero is more likely.

Figure 9:
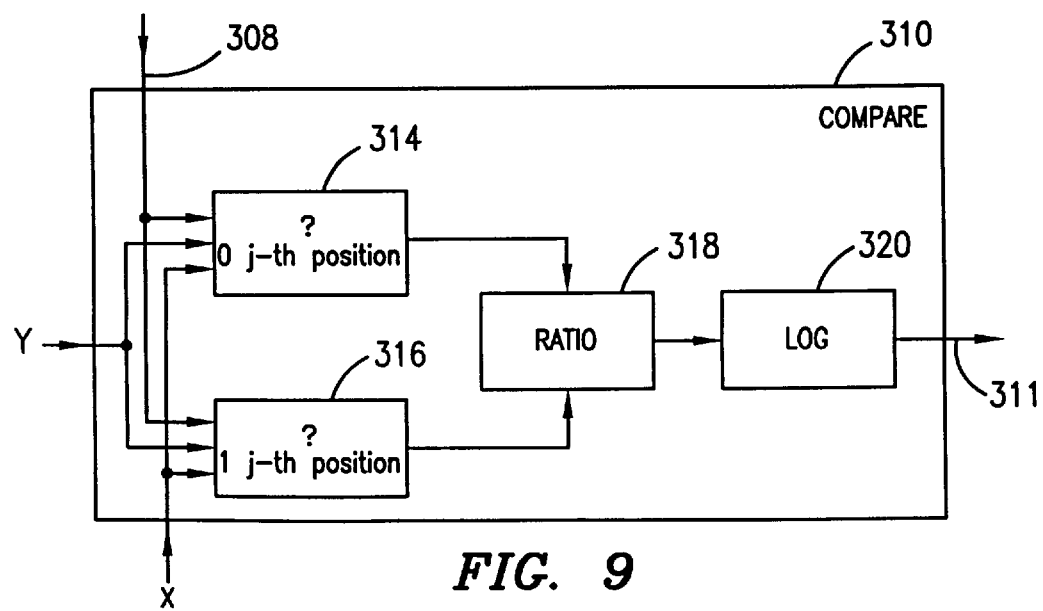

Reference is now made to FIG. 9 wherein there is shown a functional block diagram of the comparator 310. In accordance, for example, with the numerator of Equations 1 and 4, a first summer 314 sums the calculated probabilities with respect to certain ones of the codewords having a logical zero in a given information bit location. Similarly, a second summer 316 sums the calculated probabilities with respect to certain ones of the codewords having a logical one in a given information bit location. Again, these sums are taken for each of the information bit locations in the hard information output vector x. A ratiometer 318 then takes the ratio of the summed probabilities output from first and second summers 314 and 316 for each of the information bit locations. The logarithm 320 is then taken of the calculated ratio for output on line 311 as the result of the comparison operation.

Figure 10:
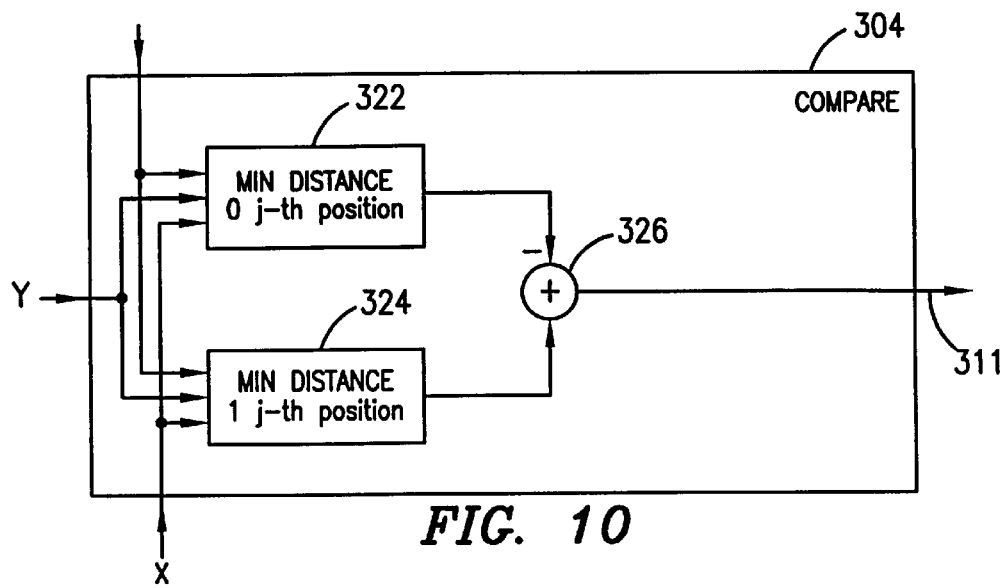

Reference is now made to FIG. 10 wherein there is shown, in a functional block diagram, a second embodiment of a portion of the reliability determination functionality 304. In accordance with, for example, the first term of Equation 2, a first element 322 calculates the closest Euclidean distance between the received vector r and a hypothetical transmitted codeword having a logical zero in a given information bit location. Similarly, a second element 324 calculates the closest Euclidean distance between the received vector r and a hypothetical transmitted codeword having a logical one in a given information bit location. Again, these calculation are taken for each of the information bit locations in the hard information output vector x. A summer 326 then subtracts the output of the first element 322 from the output of the second element 324 to generate a result for output on line 311.

Figure 11:
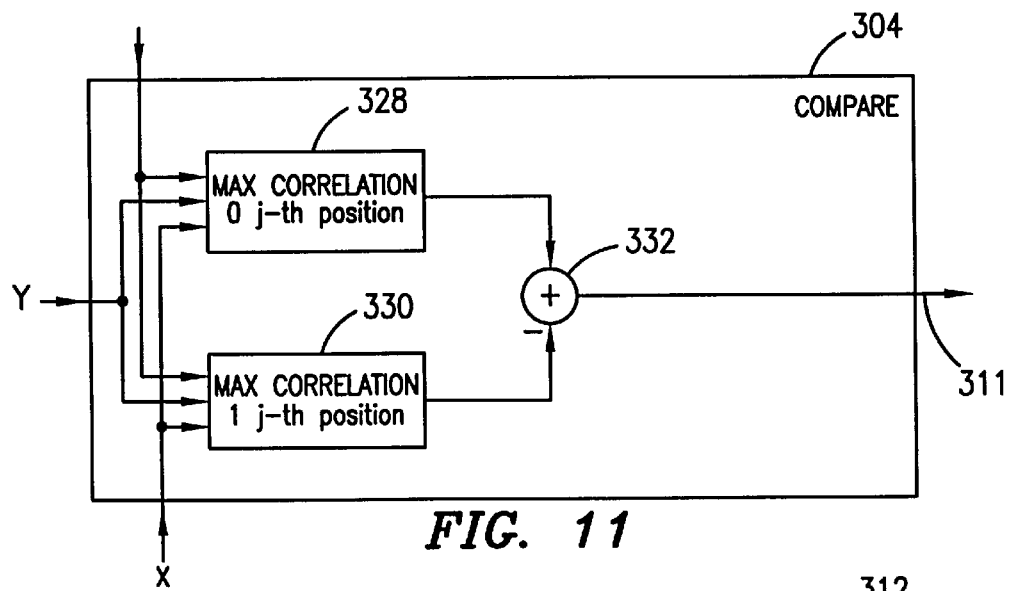

Reference is now made to FIG. 11 wherein there is shown, in a functional block diagram, a second embodiment of a portion of the reliability determination functionality 304. In accordance with, for example, the first term of Equation 5, a first correlator 328 calculates the maximal correlation between the received vector r and a hypothetical transmitted codeword having a logical zero in a given information bit location. Similarly, a second correlator 330 calculates the maximal correlation between the received vector r and a hypothetical transmitted codeword having a logical one in a given information bit location. Again, these calculation are taken for each of the information bit locations in the hard information output vector x. A summer 332 then subtracts the output of the second correlator 330 from the output of the first correlator 328 to generate a result for output on line 311.

Figure 12:
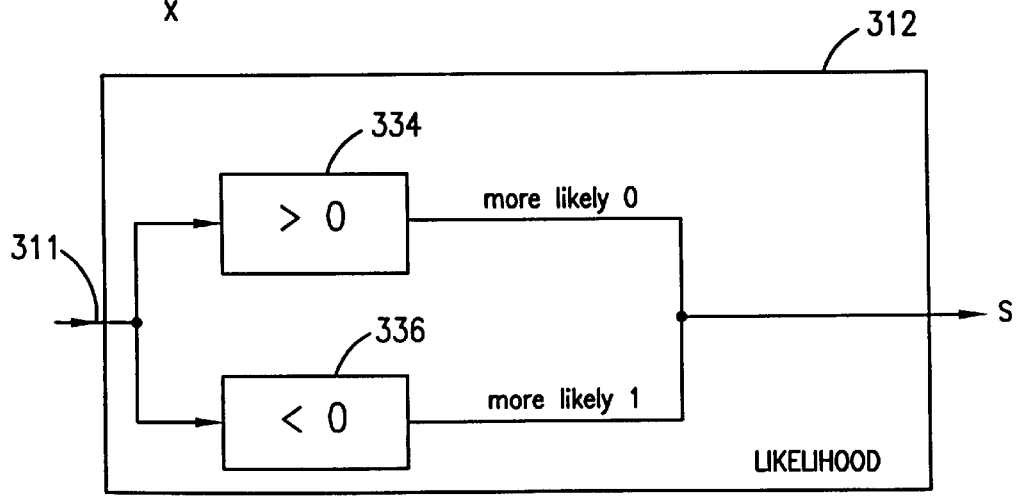

Reference is now made to FIG. 12 wherein there is shown a functional block diagram of the likelihood functionality 312 comprising a portion of reliability determination functionality 304. A first threshold detector 334 receives the result output on line 311, and determines whether the result is greater than zero. If yes, this means that the corresponding information bit location in the hard information output vector x more likely has a logical value of zero. Conversely, a second threshold detector 334 receives the result operation output on line 311, and determines whether the result is less than zero. If yes, this means that the corresponding information bit location in the hard information output vector x more likely has a logical value of one.

Although preferred embodiments of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A decoding method, comprising the steps of:

comparing a received vector r with each one of a plurality of codewords y, each codeword having an associated hard information vector x;

selecting the codeword y closest to the received vector r;

outputting the hard information vector x corresponding to the selected codeword y; and determining a reliability vector s for the output hard information vector x, the reliability vector s determined for each symbol location of the hard information vector x, as a function of each of the plurality of codewords y and the received vector r.

2. The method of claim 1 wherein the hard information vector x comprises a plurality of information bits, and wherein the step of determining comprises the steps of:

calculating values that are proportional to the probability of receiving the received vector r given the transmission of each of the plurality of codewords y;

for each of the plurality of information bits in the information vector x, comparing the calculated probabilities with respect to certain ones codewords y having a zero in a given information bit position to the calculated probabilities with respect to the same certain ones of codewords y having a one in that certain information bit position; and identifying from the comparison an indication of whether the hard information output x in that same information bit position is more likely a one or a zero.

3. The method of claim 2 wherein the step of comparing comprises the steps of:

first summing the calculated values with respect to the certain ones of the codewords y having a zero in the given information bit position; and second summing the calculated values with respect to the same certain ones of the certain codewords y having a one in the given information bit position.

4. The method of claim 3 wherein the step of comparing further comprises the steps of:

taking the ratio of the results of the first and second summing steps; and taking a logarithm of the generated ratio.

5. The method of claim 4 wherein the step of identifying comprises the steps of:

indicating that a zero is more likely if the result of taking the logarithm of the generated ratio is greater than zero; and indicating that a one is more likely if the result of taking the logarithm of the generated ratio is less than zero.

6. The method as in claim 2 further including the step of selecting the certain ones of the codewords y from the plurality of codewords y.

7. The method as in claim 6 wherein step of selecting comprises the step of choosing as the certain ones of the codewords y those ones of the plurality of codewords y closest to the received vector r.

8. The method as in claim 6 wherein the step of choosing selects those ones of the plurality of codewords y having a minimal Euclidean distance with respect to the received vector r.

9. The method as in claim 6 wherein the step of choosing selects those ones of the plurality of codewords y having a maximal correlation with respect to the received vector r.

10. The method of claim 1 wherein the step of determining comprises the steps of:

first minimizing the distance between the received vector r and certain ones of the codewords y having a zero in the given information bit position; and second minimizing the distance between the received vector r and certain ones of the codewords y having a one in the given information bit position.

11. The method of claim 10 wherein the step of determining further comprises the step of subtracting the result of the first minimization from the result of the second minimization.

12. The method of claim 11 wherein the step of determining further comprises the steps of:

indicating that a zero is more likely if the result of subtraction is greater than zero; and indicating that a one is more likely if the result of the subtraction is less than zero.

13. The method of claim 1 wherein the step of determining comprises the steps of:

first maximizing the correlation between the received vector r and certain ones of the codewords y having a zero in the given information bit position; and second maximizing the correlation between the received vector r and certain ones of the codewords y having a one in the given information bit position.

14. The method of claim 13 wherein the step of determining further comprises the step of subtracting the result of the second maximization from the result of the first maximization.

15. The method of claim 14 wherein the step of determining further comprises the steps of:

indicating that a zero is more likely if the result of subtraction is greater than zero; and indicating that a one is more likely if the result of the subtraction is less than zero.

16. The method as in claim 1 wherein plurality of codewords y comprise Hadamard codewords.

17. The method as in claim 1 wherein plurality of codewords y comprise Reed-Solomon codewords.

18. The method as in claim 1 further comprising the steps of:

processing the generated reliability vector s to identify the presence of errors;

comparing a number of the identified errors to a predetermined threshold; and signaling for a rejection of the received data transmission if the number of identified errors exceeds the predetermined threshold.

19. The method of claim 18 further including the step of requesting re-transmission of the data if the number of identified errors exceeds the predetermined threshold.

20. A decoder, comprising:

means for comparing a received vector r with each one of a plurality of codewords y, each codeword having an associated hard information vector x, selecting the codeword y closest to the received vector r, and outputting the hard information vector x corresponding to the selected codeword y; and means for determining a reliability vector s for the output hard information vector x, the reliability vector s determined for each symbol location of the hard information vector x as a function of each of the plurality of codewords y and the received vector r.

21. The decoder of claim 20 wherein the hard information vector x comprises a plurality of information bits, and wherein the means for determining comprises:

means for calculating values that are proportional to the probability of receiving the received vector r given the transmission of each of the plurality of codewords y; and means for comparing, for each of the plurality of information bits in the information vector x, the calculated probabilities with respect to certain ones codewords y having a zero in a given information bit position to the calculated probabilities with respect to the same certain ones of codewords y having a one in that certain information bit position to identify whether the hard information output x in that same information bit position is more likely a one or a zero.

22. The decoder of claim 21 wherein the means for comparing comprises:

first means for summing the calculated values with respect to the certain ones of the codewords y having a zero in the given information bit position;

second means for summing the calculated values with respect to the same certain ones of the certain codewords y having a one in the given information bit position;

means for taking the ratio of the results of the first and second summing steps; and means for taking a logarithm of the generated ratio.

23. The decoder of claim 22 further including:

means for indicating that a zero is more likely if the result of taking the logarithm of the generated ratio is greater than zero; and means for indicating that a one is more likely if the result of taking the logarithm of the generated ratio is less than zero.

24. The decoder of claim 20 wherein the means for determining comprises:

first means for minimizing the distance between the received vector r and certain ones of the codewords y having a zero in the given information bit position;

second means for minimizing the distance between the received vector r and certain ones of the codewords y having a one in the given information bit position; and means for subtracting the result of the first minimization from the result of the second minimization.

25. The decoder of claim 24 further including:

means for indicating that a zero is more likely if the result of subtraction is greater than zero; and means for indicating that a one is more likely if the result of the subtraction is less than zero.

26. The decoder of claim 20 wherein the means for determining comprises:

first means for maximizing the correlation between the received vector r and certain ones of the codewords y having a zero in the given information bit position;

second means for maximizing the correlation between the received vector r and certain ones of the codewords y having a one in the given information bit position; and means for subtracting the result of the second maximization from the result of the first maximization.

27. The decoder of claim 26 further including:

means for indicating that a zero is more likely if the result of subtraction is greater than zero; and means for indicating that a one is more likely if the result of the subtraction is less than zero.

28. The decoder as in claim 20 wherein plurality of codewords y comprise Hadamard codewords.

29. The decoder as in claim 20 wherein plurality of codewords y comprise Reed-Solomon codewords.

30. The decoder as in claim 20 further comprising:

means for processing the generated reliability vector s to identify the presence of errors;

means for comparing a number of the identified errors to a predetermined threshold; and means for signaling for a rejection of the received data transmission if the number of identified errors exceeds the predetermined threshold.

31. The decoder of claim 30 further including means for requesting re-transmission of the data if the number of identified errors exceeds the predetermined threshold.

* * * * *